(12) United States Patent
Dillon et al.

(10) Patent No.: US 8,102,031 B2
(45) Date of Patent: Jan. 24, 2012

(54) SECURITY ELEMENT FOR AN INTEGRATED CIRCUIT, INTEGRATED CIRCUIT INCLUDING THE SAME, AND METHOD FOR SECURING AN INTEGRATED CIRCUIT

(75) Inventors: Brian Dillon, Carrollton, TX (US); Christopher J. Progler, Plano, TX (US)

(73) Assignee: Photronics, Inc., Brookfield, CT (US)

( * ) Notice: Subject to any disclaimer, the term of this patent is extended or adjusted under 35 U.S.C. 154(b) by 744 days.

(21) Appl. No.: 12/106,033

(22) Filed: Apr. 18, 2008

(65) Prior Publication Data

US 2008/0258754 A1    Oct. 23, 2008

Related U.S. Application Data

(60) Provisional application No. 60/925,519, filed on Apr. 20, 2007.

(51) Int. Cl.
*H01L 21/00* (2006.01)

(52) U.S. Cl. .............................. 257/659; 257/531; 326/8

(58) Field of Classification Search .................. 257/531, 257/659; 326/8
See application file for complete search history.

(56) References Cited

U.S. PATENT DOCUMENTS

| | | | | |
|---|---|---|---|---|
| 5,745,076 | A * | 4/1998 | Turlington et al. | 342/372 |
| 5,831,324 | A * | 11/1998 | Bang | 257/508 |
| 5,940,031 | A * | 8/1999 | Turlington et al. | 342/372 |
| 6,852,619 | B2 * | 2/2005 | Okabe | 438/637 |
| 6,982,477 | B2 * | 1/2006 | Adan | 257/659 |
| 7,310,243 | B2 * | 12/2007 | Gilliland et al. | 361/818 |
| 7,543,262 | B2 * | 6/2009 | Wang et al. | 716/119 |
| 7,875,955 | B1 * | 1/2011 | Hopper et al. | 257/531 |
| 7,936,052 | B2 * | 5/2011 | Barth et al. | 257/659 |
| 2002/0011612 | A1 * | 1/2002 | Hieda | 257/262 |
| 2003/0227090 | A1 * | 12/2003 | Okabe | 257/760 |
| 2004/0195692 | A1 * | 10/2004 | Adan | 257/758 |
| 2005/0275061 | A1 * | 12/2005 | Ohguro | 257/531 |
| 2006/0011369 | A1 * | 1/2006 | Gilliland et al. | 174/35 R |
| 2007/0130553 | A1 * | 6/2007 | Wang et al. | 716/11 |
| 2008/0258754 | A1 * | 10/2008 | Dillon et al. | 326/8 |
| 2009/0090995 | A1 * | 4/2009 | Yang et al. | 257/531 |
| 2010/0078776 | A1 * | 4/2010 | Barth et al. | 257/659 |
| 2010/0078777 | A1 * | 4/2010 | Barth et al. | 257/659 |
| 2010/0193904 | A1 * | 8/2010 | Watt et al. | 257/531 |
| 2010/0219513 | A1 * | 9/2010 | Zhang et al. | 257/659 |

* cited by examiner

*Primary Examiner* — Laura Menz

(74) *Attorney, Agent, or Firm* — Amster, Rothstein & Ebenstein LLP

(57) ABSTRACT

An integrated circuit including a substrate; a circuit pattern formed over the substrate; and one or more fences formed around edges of the circuit pattern, each of the one or more fences having a determined electrical resistance which is used to detect the addition of malicious circuitry. Each fence has a determined electrical resistance which is used to monitor the validity of the fence.

9 Claims, 2 Drawing Sheets

SECURITY ELEMENT FOR AN INTEGRATED CIRCUIT, INTEGRATED CIRCUIT INCLUDING THE SAME, AND METHOD FOR SECURING AN INTEGRATED CIRCUIT

RELATED APPLICATIONS

This application is a non-provisional application claiming priority to U.S. Provisional Patent Application Ser. No. 60/925,519 filed Apr. 20, 2007.

FIELD OF THE INVENTION

The present invention relates to integrated circuits, and in particular to security features applied to an integrated circuit that detects alteration of the integrated circuit.

BACKGROUND OF THE INVENTION

If left unprotected, integrated circuits (ICs) are subject to alteration, by either deletion of design data or insertion of such data. Such alteration may be particularly unwanted when the IC is used in sensitive applications. Conventionally, a determination of whether an IC has been altered by deletion of design data can be done using built-in self-testing (BIST). However, detecting the addition of malicious circuitry poses a more challenging problem. Further, even when checking for deletions using BIST, each device in the IC must be checked. Thus, conventional methods, such as BIST, are not optimally effective in securing ICs against alteration.

SUMMARY OF THE INVENTION

An integrated circuit according to an exemplary embodiment of the present invention comprises a substrate; a circuit pattern formed over the substrate; and one or more fences formed around edges of the circuit pattern, each of the one or more fences having a determined electrical resistance.

In at least one embodiment, the circuit pattern comprises one or more layers, and at least one of the one or more fences is formed at each layer.

A method of securing an integrated circuit having a circuit pattern according to an exemplary embodiment of the present invention comprises the steps of: analyzing design data for the circuit pattern to determine edges of the circuit pattern; determining a route that surrounds the edges of the circuit pattern; and forming a fence along the route, wherein the fence has a determined electrical resistance.

In at least one embodiment, the step of analyzing comprises dividing the design data into partitions.

In at least one embodiment, the step of analyzing comprises determining which partitions are too close together to accommodate circuitry.

In at least one embodiment, the method further comprises a step of merging the partitions that are too close together to accommodate circuitry.

In at least one embodiment, the step of merging comprising polygon merging.

In at least one embodiment, the step of determining the route comprises applying a set of rules to ensure that the route provides at least a minimum clearance from the edges of the circuit pattern.

In at least one embodiment, the step of forming a fence comprises forming the fence in a polygon format.

In at least one embodiment, the step of forming a fence further comprises generating layout data for the fence.

In at least one embodiment, the layout data is generated using a set of rules.

In at least one embodiment, the step of forming a fence comprises maintaining a running sum of resistances for the fence.

A method of testing an integrated circuit comprising a substrate, a circuit pattern formed over the substrate, and one or more fences formed around edges of the circuit pattern, each of the one or more fences having a determined electrical resistance, according to an exemplary embodiment of the present invention comprises the steps of: measuring electrical resistance of the one or more fences; and comparing the measured electrical resistance to the determined electrical resistance.

In at least one embodiment, the circuit pattern comprises one or more layers, at least one of the one or more fences is formed at each layer, and the method further comprises: measuring inter-layer capacitance of the fences formed at each layer; and comparing the inter-layer capacitance to a determined inter-layer capacitance of the fences at each layer.

These and other features of this invention are described in, or are apparent from, the following detailed description of various exemplary embodiments of this invention.

BRIEF DESCRIPTION OF THE DRAWINGS

Various exemplary embodiments of this invention will be described in detail, with reference to the following figures, wherein.

DETAILED DESCRIPTION OF PREFERRED EMBODIMENTS

The present invention is directed to a system and method of securing an integrated circuit against alteration. It should be appreciated that the term "integrated circuit" as used herein is intended to cover any device that includes an electric circuit pattern, having semiconductor components or otherwise, including but not limited to display devices, such as liquid crystal displays and plasma displays, microcontrollers, memory devices, processors, sensors, power management circuits and amplifiers.

More particularly, various exemplary embodiments of the present invention are directed to systems and methods for securing an IC by forming a fence around edges of the various components of the IC pattern. The fence has known electrical characteristics, such as, for example, resistance and, in the case of multiple fences formed within individual layers of the IC, inter-layer capacitance. Thus, any alteration to the fence can be detected by detecting changes in the electrical characteristics of the fence. The fence may be generated using an algorithm that has a spatial based solution so as to divide design data from white space (i.e., space in which no circuit pattern is formed).

Figure 1:
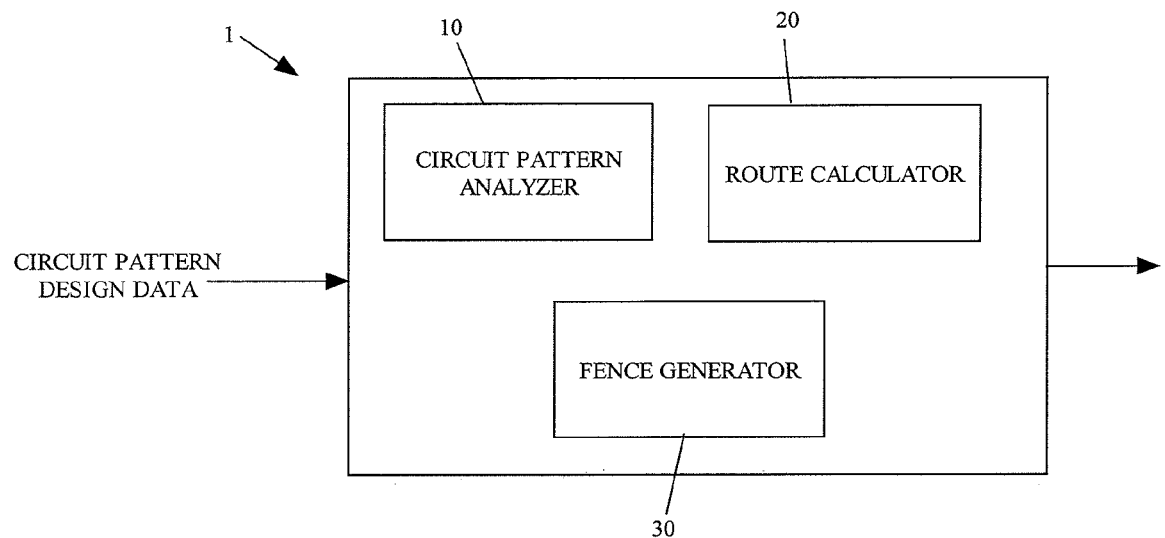
FIG. 1 is a block diagram of a system for generating a fence for an integrated circuit according to an exemplary embodiment of the present invention.

FIG. 1 is a block diagram of a system, generally designated by reference number 1, for generating a fence for an integrate circuit according to an exemplary embodiment of the present invention. The system 1 includes a circuit pattern analyzer 10, a route calculator 20, and a fence generator 30.

Figure 2A:
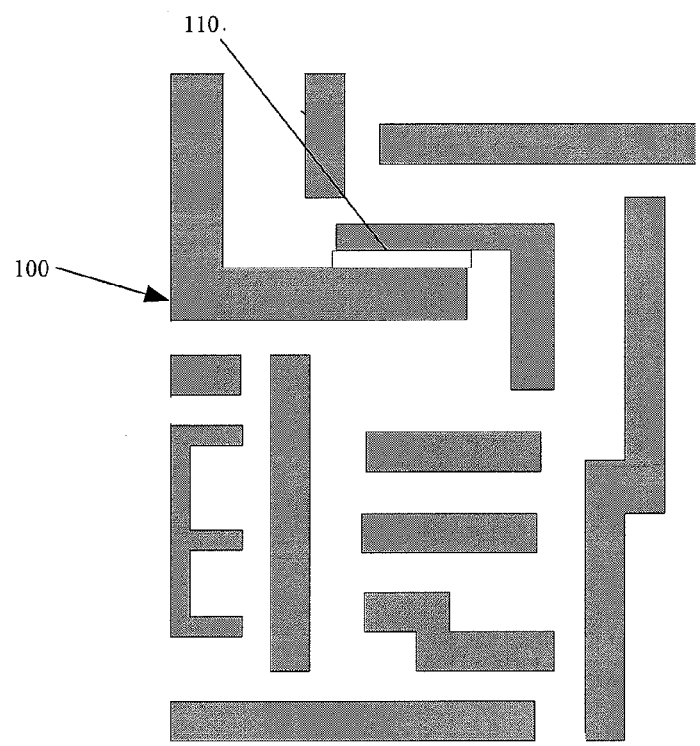
FIGS. 2A-2C are plan views of a circuit pattern showing a process of applying a fence to the circuit pattern according to an exemplary embodiment of the present invention.
Figure 2B:
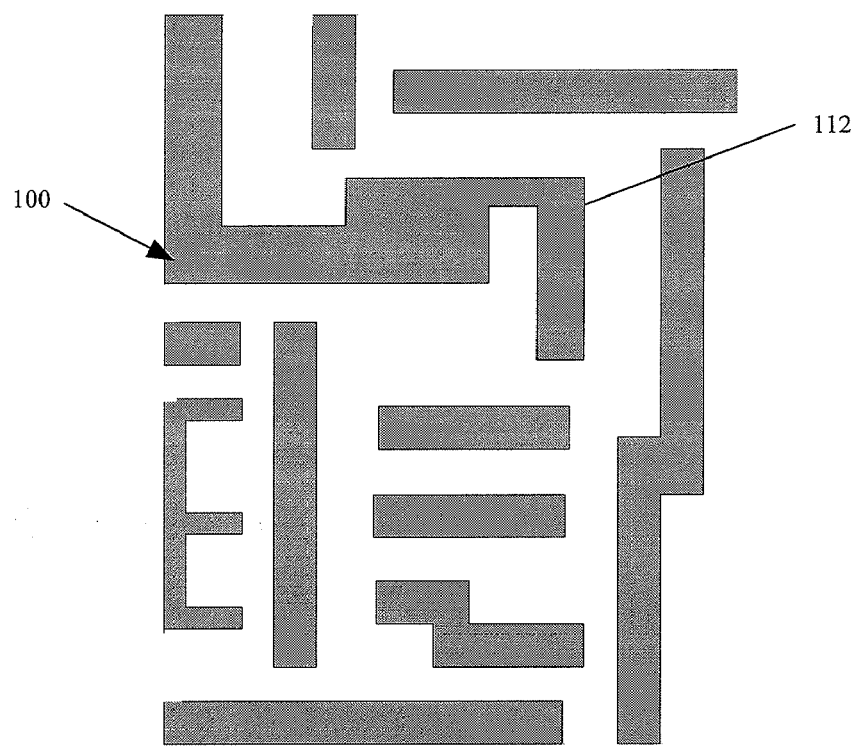

The circuit pattern analyzer 10 determines the edges of a circuit pattern. According to an embodiment of the invention, the circuit pattern analyzer 10 divides the design data into manageable partitions, and analyzes the data to determine which areas, known as small area sections, are too small to accommodate circuitry. This is shown in FIG. 2A, which shows a plan view of a circuit pattern 100 with a small area section 110. Small area section 110 is an example of an area too small to accommodate circuitry, and thus would not need a fence. Then, as shown in FIG. 2B, the circuit pattern analyzer 10 merges the small area sections 98 into the remaining partitions to define edges 112 of the circuit pattern 100 which need to be secured. Any suitable data merging technique may be used to merge the small area sections with the remaining partitions, such as, for example, polygon merging.

The route calculator 20 uses the edges 112 of the circuit pattern 100 to determine a route that surrounds the circuit pattern 100. In this regard, the route calculator 20 may use minimum width and spacing rules to ensure that the route provides adequate clearance from the edges 112 of the circuit pattern 100.

Figure 2C:
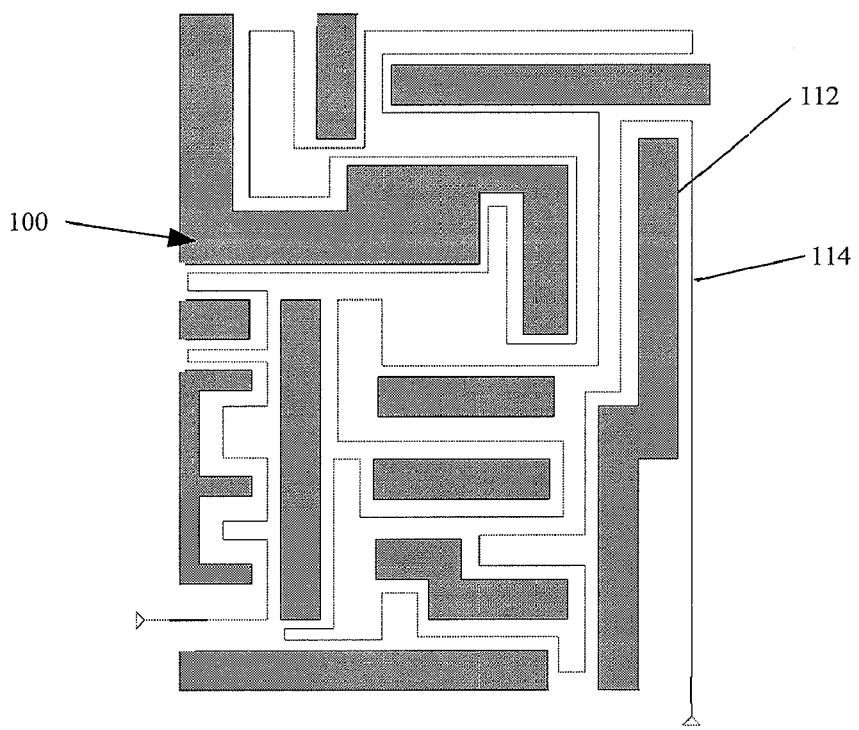

The fence generator 30 calculates layout data for the fence which follows the route generated by the route calculator 20. The fence generator 30 preferably calculates the layout data in a polygon format using a set of rules as a guide. The rules may include minimum width, desired width, maximum width, minimum space, desired space and maximum space. As the fence layout data is generated, a running sum of the resistance may be maintained, so that the overall resistance of the completed fence may be determined. Once generation of the fence layout data is complete, as shown in FIG. 2C, the data can be used to form a fence 114 around the edges 112 of the circuit pattern 100 having the determined resistance. The fence may be formed of any suitable material having effective electrical characteristics, such as, for example, metal, semiconductor material, polysilicon and doped silicon.

Preferably, a fence is built on all interconnect layers of the IC, including active layers, polysilicon layers and metal layers. Capacitances can be extracted from adjacent layers, and these capacitances and the resistances of the fences can be used to detect whether the fence has been altered. For example, according to an exemplary embodiment of the present invention, an IC including a fence may be tested by slight modifications of a conventional BIST (built-in self-test) algorithm to compensate for the fence. In particular, the BIST algorithm would need to be processed at least twice, once with the fence at ground and again with the fence at a high potential. If any unwanted circuitry crosses the fence and connects to the IC design data, the resulting short would be detectable though one of the BIST tests.

For large designs, it might be impractical to guard the entire circuit with one fence. The shorter the fence, the higher sensitivity is for detecting fence alterations. Thus, to increase sensitivity, multiple short fences may be used for a particular circuit pattern. If many fences are needed, a multiplexed input system may be required. However, this will not effect the BIST time, as it is only necessary to detect changes to electrical characteristics of the fence.

A capacitance test offers a safe guard against massive fence alterations. Someone could try to reverse engineer the fence, matching its resistance, but placing it in a different location. However, doing this on multiple layers, while also trying to match inter-level fence capacitance would prove to be nearly impossible.

While this invention has been described in conjunction with the exemplary embodiments outlined above, it is evident that many alternatives, modifications and variations will be apparent to those skilled in the art. Accordingly, the exemplary embodiments of the invention, as set forth above, are intended to be illustrative, not limiting. Various changes may be made without departing from the spirit and scope of the invention.

What is claimed is:

1. A method of securing an integrated circuit having a circuit pattern, comprising the steps of:
    analyzing design data for the circuit pattern to determine edges of the circuit pattern;
    determining a route that surrounds the edges of the circuit pattern;
    forming a fence along the route, wherein the fence has a determined electrical resistance; and
    detecting a change in the electrical resistance of the fence so as to determine an alteration of the fence.

2. The method of claim 1, wherein the step of analyzing comprises dividing the design data into partitions.

3. The method of claim 2, wherein the step of analyzing comprises determining which partitions are too close together to accommodate circuitry.

4. The method of claim 3, further comprising a step of merging the partitions that are too close together to accommodate circuitry.

5. The method of claim 1, wherein the step of determining the route comprises applying a set of rules to ensure that the route provides at least a minimum clearance from the edges of the circuit pattern.

6. The method of claim 1, wherein the step of forming a fence comprises forming the fence in a polygon format.

7. The method of claim 1, wherein the step of forming a fence further comprises generating layout data for the fence.

8. The method of claim 7, wherein the layout data is generated using a set of rules.

9. The method of claim 1, wherein the step of forming a fence comprises maintaining a running sum of electrical resistances for the fence.

* * * * *